United States Patent [19]

Myr

[11] Patent Number: 5,677,821
[45] Date of Patent: Oct. 14, 1997

[54] METHOD AND DEVICE FOR DETECTING FULL MAGNETIZATION OF ELECTRO-PERMANENT MAGNETS

[75] Inventor: Egil Myr, Kristiansand, Norway

[73] Assignee: Maritime Hydraulics A.C., Kristiansand, Norway

[21] Appl. No.: 565,361

[22] Filed: Nov. 30, 1995

[30] Foreign Application Priority Data

Nov. 30, 1994 [NO] Norway .................................. 944598

[51] Int. Cl.⁶ ...................................................... B66C 1/08
[52] U.S. Cl. ........................ 361/143; 361/144; 361/147; 335/291
[58] Field of Search ........................... 361/143–145, 361/147; 307/131; 324/263; 335/289, 290, 291

[56] References Cited

FOREIGN PATENT DOCUMENTS 1181649  2/1970  United Kingdom ............. B66C 1/08

*Primary Examiner*—Fritz Fleming
*Attorney, Agent, or Firm*—Cushman Darby & Cushman Intellectual Property Group of Pillsbury Madison & Sutro LLP

[57] ABSTRACT

A method and device for detecting full magnetization of an electro-permanent magnet which includes at least one permanent magnet part and at least one coil. Current is passed through the coil over a certain period of time in order to magnetize the electro-permanent magnet. The current through the coil of the magnet is measured during magnetization, and an increase of the derivative of the current curve is detected. A signal is given to an operator or computer if an increase in the current derivative is detected, which indicates full magnetization of the electro-permanent magnet.

7 Claims, 3 Drawing Sheets

METHOD AND DEVICE FOR DETECTING FULL MAGNETIZATION OF ELECTRO-PERMANENT MAGNETS

BACKGROUND OF THE INVENTION

The invention relates to a method for detecting full magnetization of an electro-permanent magnet and an electro-permanent magnet device.

Electro-permanent magnets are used primarily as lifting magnets for lifting objects of magnetically conductive material, such as, drill pipes in the petroleum industry. Electro-permanent magnets have a great advantage over ordinary electromagnets. While ordinary electromagnets must be supplied with electric current throughout the lift, electro-permanent magnets are only supplied with current at the start and the end of the lift.

The current is used solely to activate and deactivate the electro-permanent magnet, while a permanent magnet in the electro-permanent magnet serves to keep the electro-permanent magnet magnetically attractive during the actual lift.

Before the lift is initiated, a pulse of current is therefore passed through one or more coils in the magnet. The pulse of current induces a flux density in the core of the magnet which results in permanent magnetization thereof. After the pulse of current ceases, this magnetic field is sustained. The strength of the magnetic field is dependent upon, inter alia, the flux density that is induced in the core.

When lifting heavy objects, it is vital to obtain sufficient flux density and thus sufficient lifting capacity. The strongest magnetic field, and thus the strongest lifting power, is achieved when the core of the coil reaches saturation.

The magnetically conductive object which is to be lifted is a part of the magnetic circuit when the magnetization of the electro-permanent magnet takes place. If there is an air gap between the electro-permanent magnet and the object to be lifted, this air gap will also be a part of the magnetic circuit. This air gap causes dissipation of the magnetic field. The entire magnetic field will therefore no longer pass through the object to be lifted.

The air gap also contributes to the total reluctance of the system of electro-permanent magnet and the object to be lifted. If the total reluctance is too great, this will result in the inability to achieve saturation and the electro-permanent magnet will not be capable of reaching its maximum lifting capacity. This may result in the object which is to be lifted not being lifted with sufficient built-in security so that it could become detached during the lift if disturbances to the lift occur, such as gusts of wind, vibrations in the lifting equipment, physical obstructions which are bumped into, or the like.

It is therefore desirable to avoid such situations and ensure that the electro-permanent magnet is magnetized to its maximum before the lift is started.

GB 1 181 649 makes known a device for detecting contact between the magnet and the object to be lifted, where a piston is placed centrally, upon the magnet, which on contact with the object to be lifted is pressed in and closes an electric circuit which causes magnetization of the magnet.

This sensor means is highly unreliable, as the piston could be pressed in and close the circuit, thereby signalling contact with the object to be lifted even though small air gaps exist between the magnet and the object. Even small air gaps of this kind could result in an inadequate magnetization of the magnet. Moreover, it is extremely expensive to equip the magnet with a contact piston of this kind.

DE 1 901 611 describes a lifting magnet having a built-in alternating current magnet at the underside of the lifting magnet. When the lifting magnet is not in contact with the object to be lifted, the alternating current magnet will be open. When the lifting magnet comes into contact with the object, the alternating current magnet closes and a magnetic flux flows therethrough. This signals contact with the object.

A device of this kind for detecting contact between the magnet and the object involves providing the magnet with cost-increasing equipment, in that, firstly, a recess must be made on the underside of the magnet in which to accommodate the alternating current magnet. Furthermore, special signal cables must be laid right into the driver's cab from the alternating current magnet. Moreover, the lifting magnet may not be used if the object is not shaped to come into contact at all times with the alternating current magnet. The publication teaches the lifting of a lid with the aid of this lifting magnet. However, the same lifting magnet cannot be used to lift pipes, as it is highly unlikely that it would be possible to position the lifting magnet on a pipe in such a way that the alternating current magnet comes into contact therewith.

DE 3 212 465 teaches a lifting magnet having built-in sensor coils which on induction of a magnetic field "measure" the distance to the object to be lifted, in different directions. Just as is the case with the aforementioned device, this device is extremely expensive to produce, as sensor coils must be built into the lifting magnet during the production thereof. Furthermore, signal cables must run from the sensor coils to the driver's cab. Moreover, the coils only provide information with regard to the distance to the object. This is merely an indirect measurement of whether there is good contact between the lifting magnet and the object, and cases may be conceived of where the measuring coils register close proximity to the object, but where there will, in fact, be an air gap which falls within the tolerance zones of the measuring coils.

SUMMARY OF THE INVENTION

One of the objects of the present invention is to provide a method for detecting full magnetization of an electro-permanent magnet where it is not necessary to equip the actual lifting magnet head with additional equipment, such as sensor means or similar which require separate signal cable supply. A method is also sought provided for detecting full magnetization which gives 100% certain indication that full magnetization has truly taken place.

BRIEF DESCRIPTION OF THE DRAWINGS

The invention also relates to an electro-permanent magnet device according to claim 4.

The invention shall be described in more detail below with reference to the drawings, wherein.

DETAILED DESCRIPTION

Figure 1:
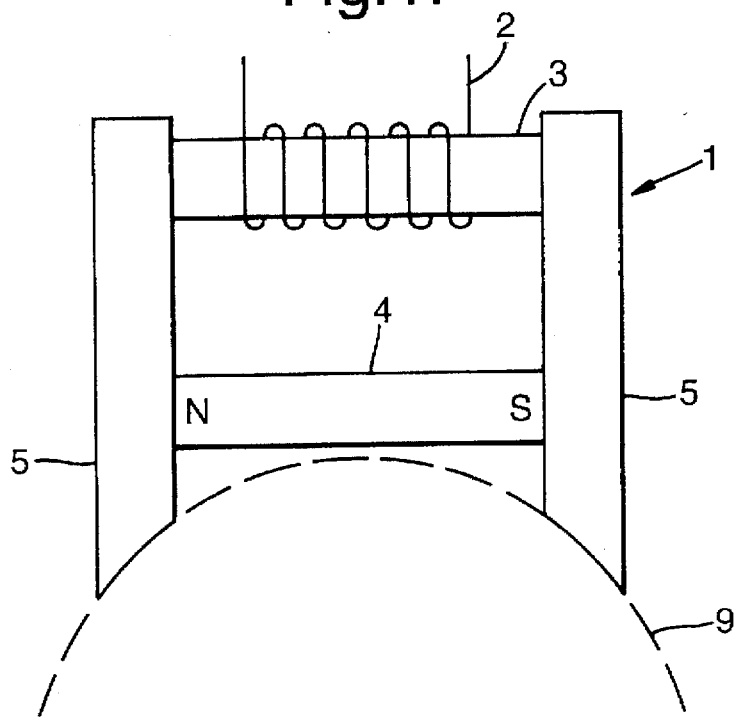
FIG. 1 is a schematic illustration of an electro-permanent magnet.

FIG. 1 shows an electro-permanent magnet 1 consisting of a coil 2 which surrounds a magnetically conductive core 3 and a permanent magnet 4 having a north pole N and a south pole S. The core 3 and the permanent magnet 4 are connected at their ends by magnetically conductive legs 5. During a lift, the legs 5 are in contact with the object to be lifted, here indicated as a pipe 6.

When current is passed through the coil 2, a magnetic flux is induced in the core 3. If the current is directed so that the core 3 is given a magnetic flux with south pole and north pole on the same side as the permanent magnet 4, the magnetic fields will reinforce one another and the lifting magnet will be able to lift a metallic object. If the north pole and the south pole of the core 3 face in the opposite direction to the north pole and the south pole of the permanent magnet 4, the two magnetic fields will neutralise one another, provided that they are of equal magnitude, and the lifting magnet will not be capable of lifting any object.

When the lifting magnet in its initial state is lowered towards an object 6 which is to be lifted, the poles of the core 3 and the poles of the permanent magnet 4 face in opposite directions. When the lifting magnet comes into physical contact with the object 6, a current is passed through the coil 2. The current is directed so that the poles of the core 3 change sides. During this magnetization, if there is good contact between the lifting magnet 1 and the object 6, the field will pass through the object 6 and ensure that the lifting magnet has maximum lifting power.

If there is an air gap between the object 6 and one or both legs 5, the flux will have a tendency to dissipate in the air gap and the air gap will also contribute to increased reluctance in the system. Even if good contact between the object 6 and the lifting magnet 1 is achieved later, the magnetic field will nevertheless be impaired because of the air gap. The lifting magnet will thus not be capable of holding such heavy objects as when magnetized to the maximum. Even if the lifting magnet were capable of holding the object, one would not know how great the margins of safety one had were, and there might be, without one knowing, great danger of the object falling.

It has been found that at full magnetization of the lifting magnet there is a small increase in the time derivative of the current in the instant the magnet 1 reaches saturation. This increase of the time derivative is seen in FIG. 5 in the form of a slight point of discontinuity 7 in the current curve 8, which shows current as a function of time during the magnetization of two electro-permanent magnets. The lifting magnets are identical, therefore the current curves are also identical. This also applies to the curves in FIGS. 3 and 4.

Figure 3:
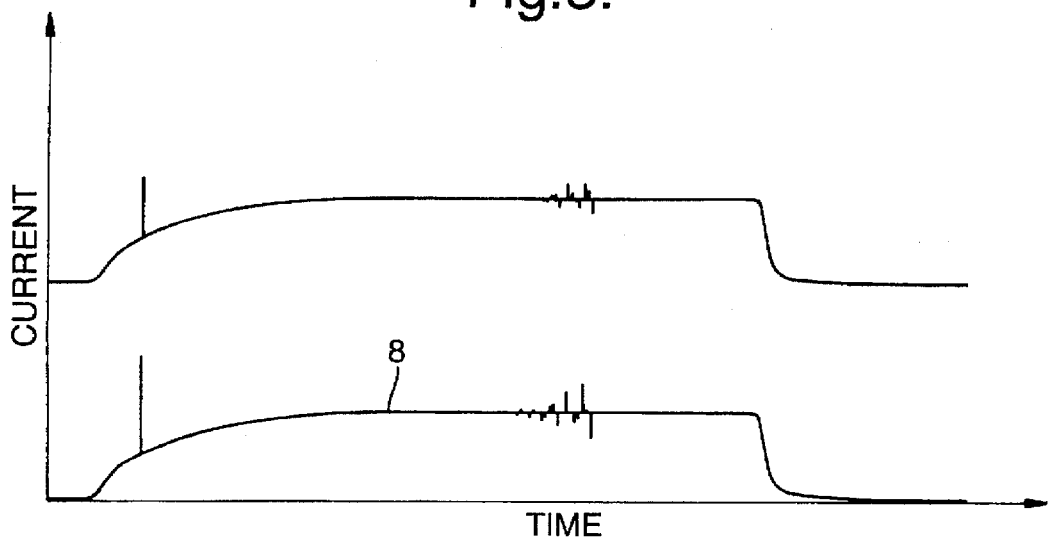
FIG. 3 shows a current curve when the electro-permanent magnet is activated in the air.
Figure 4:
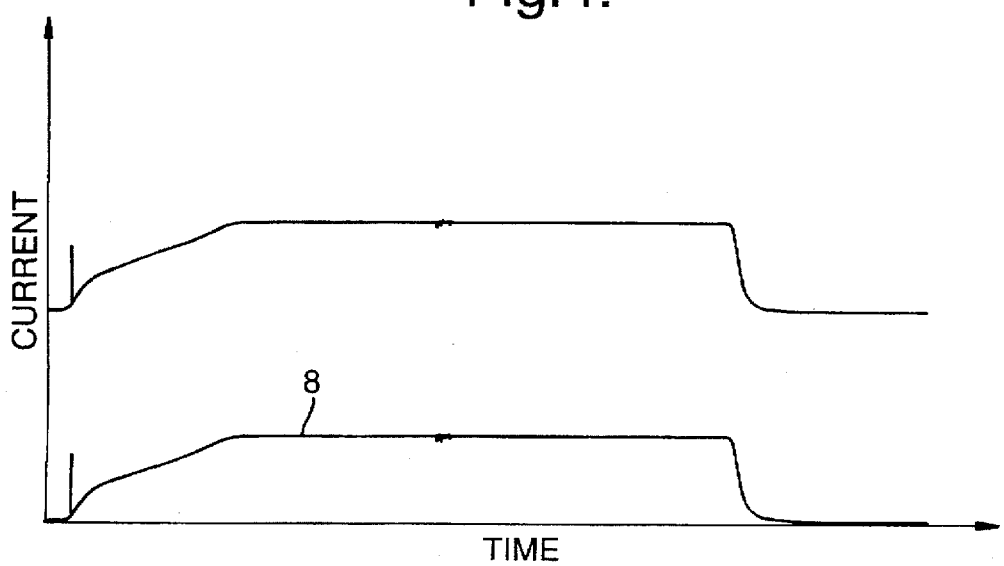
FIG. 4 shows a current curve when the electro-permanent magnet is activated in proximity to a magnetic material, but with a small air slot.
Figure 5:
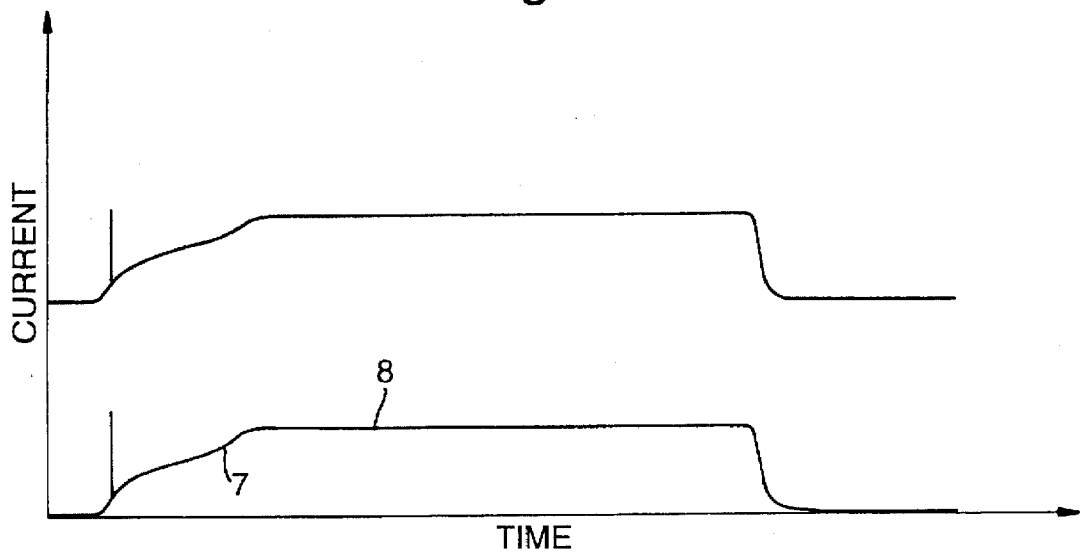
FIG. 5 shows a current curve when the electro-permanent magnet is activated during good contact with a magnetic material.

In the current curves in FIGS. 3 and 4, there is no point of discontinuity of this kind since in this case there is no good contact between the lifting magnet 1 and the object to be lifted 6. The point of discontinuity 7 occurs because the relative permeability of the coil cores 3, which prior to saturation is considerably greater than 1, falls to approximately equal to 1 after saturation. A permeablity of 1 corresponds to the permeability of air. This results in a drastic reduction of the inductance of the coil and leads in turn to an increase of the current flow through the coil. This means to say that the derivative of the current increases.

Figure 2:
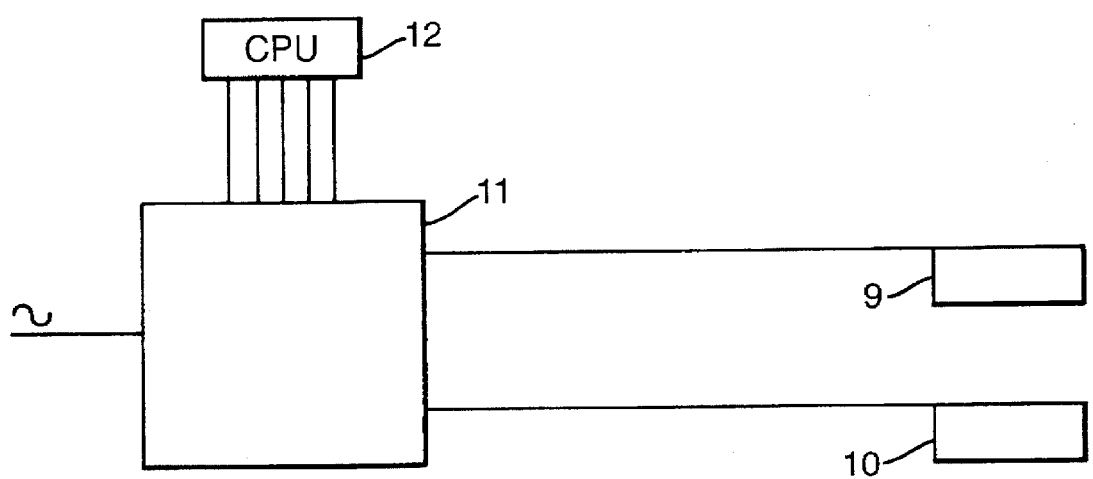
FIG. 2 illustrates a basic control system for the electro-permanent magnet.

An increase of current derivative can be detected either by an electronic or numerical circuit in a manner which will be obvious to a person versed in the art. In FIG. 2, a basic outline of a control system for the lifting magnets is shown. Two magnets are indicated by means of the reference numerals 9 and 10. The magnets are controlled by a control circuit 11 to which power is supplied, preferably in the form of alternating voltage, from outside. The alternating voltage is rectified in the control circuit 11 and fed to the lifting magnets as direct voltage when desired.

A central processing unit (CPU) 12 in the form of, for example, a computer, is connected to the control circuit 11. The CPU controls the current supply and processes collected data regarding the current supply and the current through the coil. The CPU can also be designed to interrupt an unsuccessful magnetization and automatically start a new one without any action by the operator.

Figure 6:
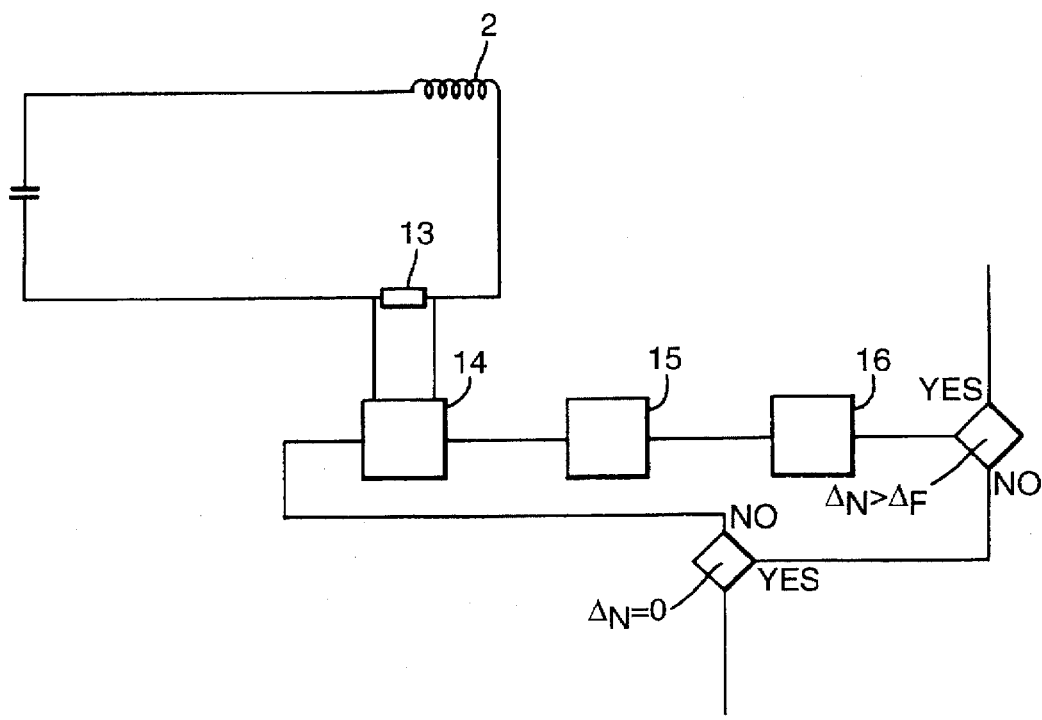
FIG. 6 is a flow chart for the detection of full magnetization.

FIG. 6 is a flow chart of a preferred embodiment of the function of the control circuit 11 and the CPU 12. The current through the coil 2 is measured across a resistor 13 by a digital ammeter 14. A differentiator 15 calculates the derivative of the current curve, and a comparator 16 compares the present value $\Delta N$ and prior value F of the derivative and signals full magnetization if the present value is greater then the prior value. If this is not the case, the comparator checks whether the derivative is zero, which indicates that the current curve has flattened out without full magnetization being reached. In this case, the attempt to lift is interrupted, the electro-permanent magnet 1 is demagnetized in that power is supplied in the opposite direction through the coil 2 so that the poles of the core 3 change sides, and the attempt to magnetize can then be repeated. This may take place either automatically or manually. If the derivative is not yet zero, the measurement of the current and the comparison of the present and prior values of the derivative is repeated once more.

This is, of course, only one of several ways in which to detect the current derivative. A person versed in the art within this field would also be able to see other ways in which to do this. For example, it is not necessary to detect whether the derivative has gone to zero, and instead one can interrupt the magnetization attempt after a certain time if saturation has not been reached. Furthermore, it will be necessary to equip the control circuit with a smoothing unit to smooth the current curve so that disturbances (which can, in fact, be seen in the curves in FIGS. 3, 4 and 5), do not have any effect on the detection of the increase in the current derivative.

An entirely analogous method of detecting the current derivative by means of suitable electronic circuits is also conceivable, but a digital processing of the measurement data is nevertheless preferable.

Furthermore, the invention is not limited to relate only to lifting magnets, but comprises all types of electro-permanent magnets and the applications these might have, and where the method, device and utilization according to the independent claims below can be used.

Such areas include, for instance, magnets used as fastening means for different objects to magnetically conductive materials, either permanently or temporarily, where for some reason or another it is not desirable or possible to use penetrating fastening means or adhesive.

Furthermore, the invention may also be used during the production of permanent magnets from materials capable of being magnetized.

Having described my invention, I claim:

1. A method for detecting full magnetization of an electro-permanent magnet having at least one permanent magnet part and at least one coil, comprising the steps of:

passing current through the coil over a certain period of time in order to magnetize the electro-permanent magnet;

measuring current through the coil of the magnet by a measuring device during magnetization;

detecting an increase of a derivative of a curve plotting the current is detected by a detection device; and the detection device signalling detection of an increase in current derivative, which indicates full magnetization of the electro-permanent magnet.

2. The method of claim 1, wherein:

said measuring device and said detection device comprise a data input/output controller for controlling magnetization of the electro-permanent magnet.

3. The method of claim 2, in further comprising:

using said electro-permanent magnet for lifting objects made of magnetically conductive materials.

4. The method of claim 1, further comprising:

using said electro-permanent magnet for lifting objects made of magnetically conductive materials.

5. An electro-permanent magnet device, comprising:

at least one permanent magnet part and at least one coil;

a measuring device for measuring a current through the coil of the electro-permanent magnet during magnetization of the electro-permanent magnet;

a detection device for detecting an increase in a derivative of the current and for signalling detection of an increase in the current derivative, as an indication of full magnetization of the electro-permanent magnet.

6. The device of claim 5, wherein:

said measuring device and said detection device comprise a data input/output controller for controlling magnetization of the electro-permanent magnet.

7. The device of claim 6, wherein:

the electro-permanent magnet is a lifting magnet.

* * * * *

UNITED STATES PATENT AND TRADEMARK OFFICE
CERTIFICATE OF CORRECTION

PATENT NO. : 5,677,821
DATED : October 14, 1997
INVENTOR(S) : MYR, Egil

It is certified that error appears in the above-identified patent and that said Letters Patent is hereby corrected as shown below:

On the title page item [73],

Please change

Maritime Hydraulics A.C.," to

—[73] Maritime Hydraulics A.S.,—.

Signed and Sealed this

Sixth Day of January, 1998

*Attest:*

BRUCE LEHMAN

*Attesting Officer*     *Commissioner of Patents and Trademarks*